(12) United States Patent
Tanaka

(10) Patent No.: US 6,812,057 B2
(45) Date of Patent: Nov. 2, 2004

(54) METHOD OF PRODUCING AN OPTICAL MODULE

(75) Inventor: Hiroyuki Tanaka, Osaka (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 130 days.

(21) Appl. No.: 09/898,031

(22) Filed: Jul. 5, 2001

(65) Prior Publication Data

US 2002/0003705 A1 Jan. 10, 2002

(30) Foreign Application Priority Data

Jul. 7, 2000 (JP) .................................. P2000-207438

(51) Int. Cl.⁷ .............................................. H01L 21/00
(52) U.S. Cl. ........................... 438/55; 438/25; 438/26; 438/65; 438/118; 362/335; 156/272.2
(58) Field of Search ................................ 427/508, 558; 438/25, 26, 64, 65, 112, 118, 127; 362/335; 156/272.2; 257/99

(56) References Cited

U.S. PATENT DOCUMENTS

| | | | |
|---|---|---|---|
| 3,950,075 A | | 4/1976 | Cook et al. |
| 4,108,747 A | * | 8/1978 | Crivello ...................... 204/159 |
| 4,613,521 A | * | 9/1986 | Smith, Jr. .................... 427/169 |
| 4,737,008 A | | 4/1988 | Ohyama et al. |
| 5,189,716 A | | 2/1993 | Matsubara et al. |
| 5,278,929 A | | 1/1994 | Tanisawa et al. |
| 5,333,224 A | | 7/1994 | Kikuchi |
| 5,337,398 A | | 8/1994 | Benzoni et al. |
| 5,347,604 A | | 9/1994 | Go et al. |
| RE34,790 E | | 11/1994 | Musk |
| 5,388,171 A | | 2/1995 | Michikoshi et al. |
| 5,447,767 A | * | 9/1995 | Tanabe et al. .............. 428/64.4 |
| 5,452,389 A | | 9/1995 | Tonai et al. |
| 5,477,008 A | * | 12/1995 | Pasqualoni et al. ........ 174/52.3 |
| 5,522,001 A | | 5/1996 | Meadowcroft |
| 5,533,159 A | | 7/1996 | Okochi et al. |
| 5,537,503 A | | 7/1996 | Tojo et al. |
| 5,546,212 A | | 8/1996 | Kunikane et al. |
| 5,588,081 A | | 12/1996 | Takahashi |
| 5,631,992 A | | 5/1997 | Takahashi et al. |
| 5,692,083 A | | 11/1997 | Bennett |

(List continued on next page.)

FOREIGN PATENT DOCUMENTS

| | | | |
|---|---|---|---|
| EP | 0887865 | | 12/1998 |
| JP | 63095143 A | * | 4/1998 |
| JP | 11-17199 | | 1/1999 |
| JP | 11017199 A | * | 1/1999 |
| JP | 2000-91642 | | 3/2000 |

*Primary Examiner*—Alexander Ghyka
(74) *Attorney, Agent, or Firm*—Whitham, Curtis & Christofferson, P.C.

(57) ABSTRACT

A method of producing an optical module in which with respect to a housing (12) having an optical part (a lens 10) received therein, an optical semiconductor device (such as a laser diode 14) of a package structure is center-aligned to be positioned on an optical axis of the optical part and is attached to the housing (12). The method comprises the steps of: applying an ultraviolet-or-heat-curable resin (30) onto a joint surface between the housing and the optical semiconductor device and curing the ultraviolet-or-heat-curable resin (30) by external irradiation with ultraviolet rays in the condition that the optical axes of the lens and the laser diode are center-aligned and joined with each other to thereby temporarily fix the optical semiconductor device to the housing; and complementarily curing non-irradiated portions of the ultraviolet-or-heat-curable resin by heating. Preferably, a heat-curable resin (40) is applied onto the outer side of the ultraviolet-or-heat-curable resin to reinforce adhesion between the optical semiconductor device and the housing.

14 Claims, 4 Drawing Sheets

U.S. PATENT DOCUMENTS

| | | |
|---|---|---|
| 5,737,465 A | 4/1998 | Okochi |
| 5,751,877 A | 5/1998 | Ishizaka et al. |
| 5,841,924 A | 11/1998 | Mugiya et al. |
| 5,936,695 A * | 8/1999 | Hida et al. .................. 349/153 |
| 6,113,284 A | 9/2000 | Wu et al. |
| 6,120,191 A | 9/2000 | Asakura et al. |
| 6,302,596 B1 | 10/2001 | Cohen et al. |
| 6,312,167 B1 | 11/2001 | Kim et al. |
| 6,354,747 B1 | 3/2002 | Irie et al. |
| 2002/0028050 A1 | 3/2002 | Tanaka et al. |
| 2003/0012496 A1 | 1/2003 | Yamagata et al. |

* cited by examiner

OVERFLOW PORTION

METHOD OF PRODUCING AN OPTICAL MODULE

BACKGROUND OF THE INVENTION

The present invention relates to a method of producing an optical module in which an optical semiconductor device of a package structure and optical parts such as a lens or the like are center-aligned with each other and held by a housing. More specifically, the present invention relates to a method of producing an optical module which comprises the steps of: applying an ultraviolet-or-heat-curable resin onto a joint portion between an optical semiconductor device and a housing; irradiating the resin at the joint portion with ultraviolet rays; and heating the resin at the joint portion to fix the optical semiconductor device to the housing.

An optical module is a device in which an optical semiconductor device (for example, a semiconductor light-emitting device such as a laser diode or the like, or a semiconductor light-detecting device such as a photodiode or the like) and optical parts (such as a lens, an optical fiber ferrule or the like) are center-aligned with each other and held. For example, an optical module used in the field of optical communication is constituted by a structure which comprises an optical semiconductor device, a lens, and a housing for holding the optical semiconductor device and the lens and for fittingly holding a ferrule of a mating optical plug and in which, when the optical plug is connected, the optical semiconductor device is optically coupled with an optical fiber in the ferrule through the lens.

A spherical lens is widely used as a lens to be incorporated in such an optical module because of its advantages that a highly accurate product can be obtained easily only by mechanical processing and hence can be produced at a low cost, and that the lens has no directionality so that it is not required to adjust the direction when the lens is to be mounted in an optical module and the assembling of the optical module is facilitated. An aspherical lens, a gradient index rod lens, or the like, may be also used. Although a metal housing was widely used as the housing for holding the optical semiconductor device and the lens, a resin housing is widely used recently from the point of view of excellent workability and cost saving because of its advantage that the lens can be insert-molded in the housing or can be held by a plurality of claw-like protrusions. A structure in which a device body is sealed with a metal cap type package is generally widely used as the optical semiconductor device.

To produce such an optical module, generally, an optical semiconductor device, a lens and a fiber are center-aligned to have optically optimal positional relations and then the optical semiconductor device is fixed to a housing containing the lens. When, for example, a laser diode is used as the optical semiconductor device, the optical semiconductor device is fixed to the housing in the position where the intensity of output light taken out from the operated laser diode through the optical fiber is maximized. It is therefore necessary to prevent lowering of optical coupling efficiency due to displacement of parts when the housing and the optical semiconductor device are fixed. A method requiring a long heating time and a method accompanying mechanical impact are not desirable.

Therefore, when the housing is made of a metal, an YAG laser-welding method, or the like, is used as a typical fixation technique. When the housing is made of a resin, a method of curing a heat-curable resin such as an epoxy resin by high-frequency induction heating (see JP-A-2000-91642), or the like, is used.

The method of curing a heat-curable resin by high-frequency induction heating is excellent in the advantage that joining can be completed in a short time. There is however a problem that local temperature rising due to high-frequency induction heating is high.

Although a method using an ultraviolet-curable adhesive agent for adhesion in seconds may be hence conceived, the ultraviolet-curable adhesive agent is generally low in adhesive strength and it cannot be said that the ultraviolet-curable adhesive agent has good weather resistance. Moreover, the adhesive agent applied cannot be entirely irradiated with ultraviolet rays (portions shaded by the housing and the optical semiconductor device package are generated). Hence, portions flowing into the inside of the housing are kept uncured. There is a risk that the uncured adhesive agent may flow or fly to contaminate the front surface of the lens or the optical semiconductor device. It is hence difficult to use this method.

SUMMARY OF THE INVENTION

An object of the present invention is to provide a method of producing an optical module in which a housing and an optical semiconductor device of a package structure can be assembled in sufficient adhesive strength, high accuracy and good workability.

The present invention provides a method of producing an optical module in which with respect to a housing having an optical part received therein, an optical semiconductor device of a package structure is center-aligned to be positioned on an optical axis of the optical part and attached to the housing. The optical module is assembled through the method according to the present invention comprising the steps of: applying an ultraviolet-or-heat-curable resin onto a joint surface between the housing and the optical semiconductor device, and curing the ultraviolet-or-heat-curable resin by external irradiation with ultraviolet rays in a condition that the optical axis of the optical semiconductor device is center-aligned and joined with that of the optical part in the housing to thereby temporarily fix the optical semiconductor device to the housing; and heating the ultraviolet-or-heat-curable resin to complementarily cure non-irradiated portions of the ultraviolet-or-heat-curable resin.

The "ultraviolet-or-heat-curable resin" used in the present invention has a function of being cured by either one of the actions of ultraviolet-ray irradiation and heating. In this respect, the "ultraviolet-or-heat-curable resin" is different from a so-called "ultraviolet-and-heat-curable resin". For example, an epoxy resin containing both a heat-active cationic catalyst and an ultraviolet-active cationic catalyst is used as the "ultraviolet-or-heat-curable resin".

Examples of the optical part received in the housing are a lens, an optical fiber ferrule, and so on. The housing may exclusively have a structure that a lens is built in. Or the housing may have a structure that a ferrule of a counter optical plug is fittingly held as well as a lens is built in. In the latter case, the optical semiconductor device of the package structure is center-aligned so as to be positioned on an optical axis of the lens and the ferrule, by which the housing and the optical semiconductor device are fixed to each other. The method according to the present invention can be applied also to a small-size optical module in which the optical semiconductor device is directly bonded to a ferrule bore. For example, the housing is made of an opaque resin. Typically, the optical semiconductor device has a metal cap type package structure.

When externally irradiated with ultraviolet rays, a large part of the ultraviolet-or-heat-curable resin applied is cured by irradiation with the ultraviolet rays. In this step, the housing and the optical semiconductor device are temporarily fixed to each other while they are in a center-aligned state. Hence, even in the case where the temporarily fixed optical module is taken out from a retention jig for ultraviolet-ray irradiation, there is no risk that the center-aligned state may be collapsed. A part of the ultraviolet-or-heat-curable resin is not irradiated with ultraviolet rays because the part is shaded by the housing, the optical semiconductor device package, or the like. Hence, the part of the ultraviolet-or-heat-curable resin is uncured. The uncured part of the ultraviolet-or-heat-curable resin is, however, complementarily cured by heating after the ultraviolet-ray irradiation. In this manner, the whole of the ultraviolet-or-heat-curable resin is entirely cured, so that the housing and the optical semiconductor device are fixed to each other in a center-aligned state.

In accordance with the composition and characteristic of the ultraviolet-or-heat-curable resin or in accordance with the environment of use of the optical module, or the like, a sufficient effect may be obtained by fixation with the ultraviolet-or-heat-curable resin alone. On the other hand, when weather resistance becomes an issue, there may be used a method of forming a protective film on the outer surface of the ultraviolet-or-heat-curable resin. As will be described later, the more preferable method is, however, to provide a heat-curable resin on the outer surface side of the ultraviolet-or-heat-curable resin to thereby reinforce adhesion.

The present disclosure relates to the subject matter contained in Japanese patent application No. 2000-207438 (filed on Jul. 7, 2000), which is expressly incorporated herein by reference in its entirety.

DESCRIPTION OF THE PREFERRED EMBODIMENT

Figure 1:
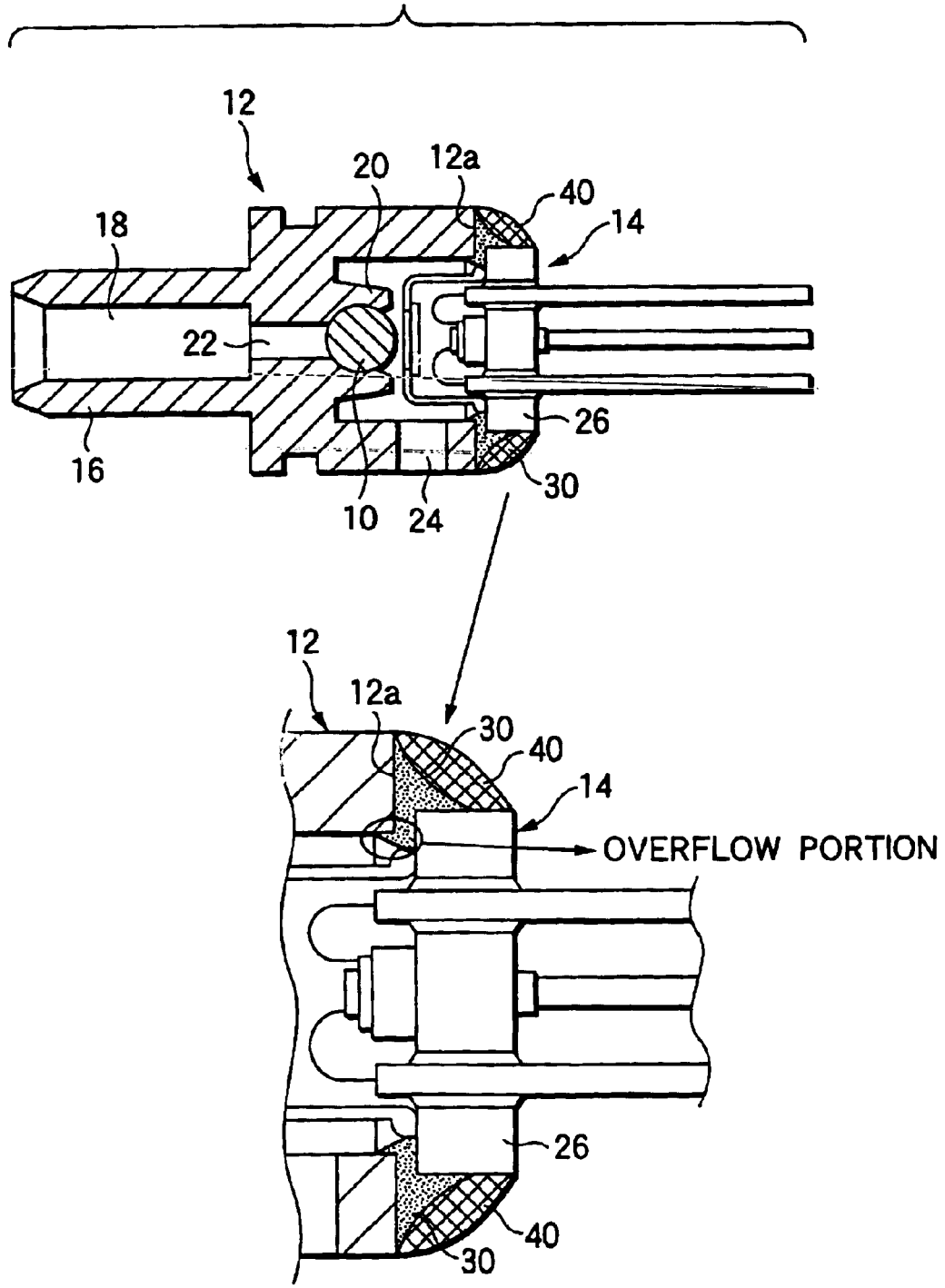
FIG. 1 is a sectional view showing an example of an optical module obtained by a method according to the present invention.

As a preferable embodiment of the present invention, there is provided a method of producing an optical module comprising the steps of:

applying an ultraviolet-or-heat-curable resin circularly onto a joint surface between an end portion of a housing and the stem portion of the optical semiconductor device and curing the ultraviolet-or-heat-curable resin by irradiation with ultraviolet rays from the outside of the stem portion in the condition that the optical axis of the optical semiconductor device is center-aligned and joined with that of the lens in the housing to thereby temporarily fix the optical semiconductor device to the housing;

heating the ultraviolet-or-heat-curable resin to complementarily cure non-irradiated portions of the ultraviolet-or-heat-curable resin; and applying a heat-curable resin circularly along the outer circumferential surface of the stem portion of the optical semiconductor device on the end portion of the housing to cover the ultraviolet-or-heat-curable resin with the heat-curable resin and curing the heat-curable resin by atmospherically heating to thereby reinforce adhesion between the optical semiconductor device and the housing.

In this method, the heating condition (heating method, heating temperature, heating time, etc.), the retention posture of the optical module, and so on, can be changed in accordance with the characteristic of each resin in the complementarily curing step and the adhesion reinforcing step. Hence, the degree of freedom in combination of kinds of resins is large, so that process management is facilitated. There is an advantage that best characteristic such as adhesive strength can be realized easily. There is also an advantage that the ultraviolet-or-heat-curable resin having not been sufficiently cured in the inside of the housing, or the like, and the heat-curable resin applied after the ultraviolet-or-heat-curable resin can be prevented from being mixed with each other in an uncured liquid or gel state so as to securely prevent bad influence on both the resins.

As a further preferable embodiment of the present invention, there is provided a method of producing an optical module comprising the steps of:

applying an ultraviolet-or-heat-curable resin circularly onto a joint surface between an end portion of a housing and the stem portion of the optical semiconductor device and curing the ultraviolet-or-heat-curable resin by irradiation with ultraviolet rays from the outside of the stem portion in the condition that the optical axis of the optical semiconductor device is center-aligned and joined with that of the lens in the housing to thereby temporarily fix the optical semiconductor device to the housing; and applying a heat-curable resin circularly along the outer circumferential surface of the stem portion of the optical semiconductor device on the end portion of the housing to cover the ultraviolet-or-heat-curable resin with the heat-curable resin to thereby complementarily cure non-irradiated portions of the ultraviolet-or-heat-curable resin and, at the same time, to thereby reinforce adhesion between the optical semiconductor device and the housing by atmospherically heating.

Although this method is limited in combination of the ultraviolet-or-heat-curable resin and the heat-curable resin that can be used, there is an advantage that the production steps can be shortened because both complementarily curing and adhesion reinforcing are completed in one time by atmospherically heating.

The "ultraviolet-or-heat-curable resin" used in the present invention has a function of being cured by either one of the actions of ultraviolet-ray irradiation and heating. In this respect, the "ultraviolet-or-heat-curable resin" is different from a so-called "ultraviolet-and-heat-curable resin". The "ultraviolet-and-heat-curable resin" requires the simultaneous application of both the ultraviolet ray and the heat for curing. That is, the "ultraviolet-and-heat-curable resin" is not cured when only one of the ultraviolet ray and the heat is applied thereto, and is cured only when both the ultraviolet ray and the heat are applied thereto simultaneously. Therefore, the "ultraviolet-or-heat curable resin" used in the present invention is different from the "ultraviolet-and-heat curable resin".

Embodiment

FIG. 1 is a view for explaining assembly showing an example of an optical module produced by a method according to the present invention. A laser diode (optical semiconductor device) 14 having a device body airtightly sealed with a metal cap type package is mounted in a resin housing 12 containing a spherical lens 10 and for fittingly holding a ferrule of a counter optical plug to thereby produce the optical module. On this occasion, optical axes are center-aligned so that the laser diode 14 is optically coupled with an optical fiber in the ferrule by the spherical lens 10 when the optical plug is connected.

The resin housing 12 is an integrally molded article substantially shaped like a pipe as a whole. One end portion 12a of the resin housing 12 is a portion for mounting the laser diode 14. A portion near the center of the inside of the resin housing 12 forms a portion for fixing the spherical lens 10. A region of from the center to the opposite end portion forms a receptacle portion 16. The receptacle portion 16 has a bore (hollow portion) 18 in which the ferrule of the counter optical plug will be just fitted. In this embodiment, the resin housing 12 is constituted by a black or gray opaque liquid-crystal polymer.

The portion for fixing the spherical lens is constituted by claw-like protrusions 20 formed around the center axis so that each of the claw-like protrusions 20 has a pointed end portion protruded toward the laser diode 14 and overhung on the inner circumferential side. The claw-like protrusions 20 are arranged and formed so as to be divided into three circumfentially evenly. A through-hole 22 is formed on the optical axis in a range of from the inner base end portion of the claw-like protrusions 20 to the bore 18. The through-hole 22 serves as a passage for a light beam. Incidentally, a through-hole 24 formed in a side wall on the spherical lens mount side of the resin housing 12 can make air flow through it to an external atmosphere. Hence, the through-hole 24 has a function of preventing drops of dew from being generated in the resin housing 12 due to the change of the atmospheric temperature.

The respective claw-like protrusions 20 are resin portions which are injection-molded so as to be integrated with a body portion of the resin housing. Specifically, a tie is formed on a base portion of a spherical pointed end portion of a core pin to be inserted in a center portion of a mold, in advance. The core pin is compelled to be pulled out just after injection of a resin into the mold to thereby form pointed-end overhang portions of the claw-like protrusions.

To fix the spherical lens, the spherical lens 10 may be thrown into the pointed end portions of the respective claw-like protrusions 20 with the laser diode mount side end portion 12a of the resin housing 12 upward and pressed into the pointed end portions by a rod-like press jig (not shown). The claw-like protrusions 20 receive the spherical lens 10 in their inside while deflected outward because of the toughness of the resin, so that the spherical lens 10 is positioned while abutting on a lens seat surface. In this state, the claw-like protrusions 20 are urged to be restored to their original shape, so that the spherical lens 10 is held and fixed by the restoring force of the claw-like protrusions 20.

A laser diode 14 is mounted in the resin housing 12 containing the spherical lens 10 as described above. On this occasion, the optical axes of the lens and the laser diode 14 are center-aligned by a metal cap portion which is inserted in the resin housing 12 so that the stem portion 26 of the laser diode 14 abuts on the end portion 12a of the resin housing 12. In this embodiment, an ultraviolet-or-heat-curable resin and a heat-curable resin are used for adhesive fixation.

Figure 2A:
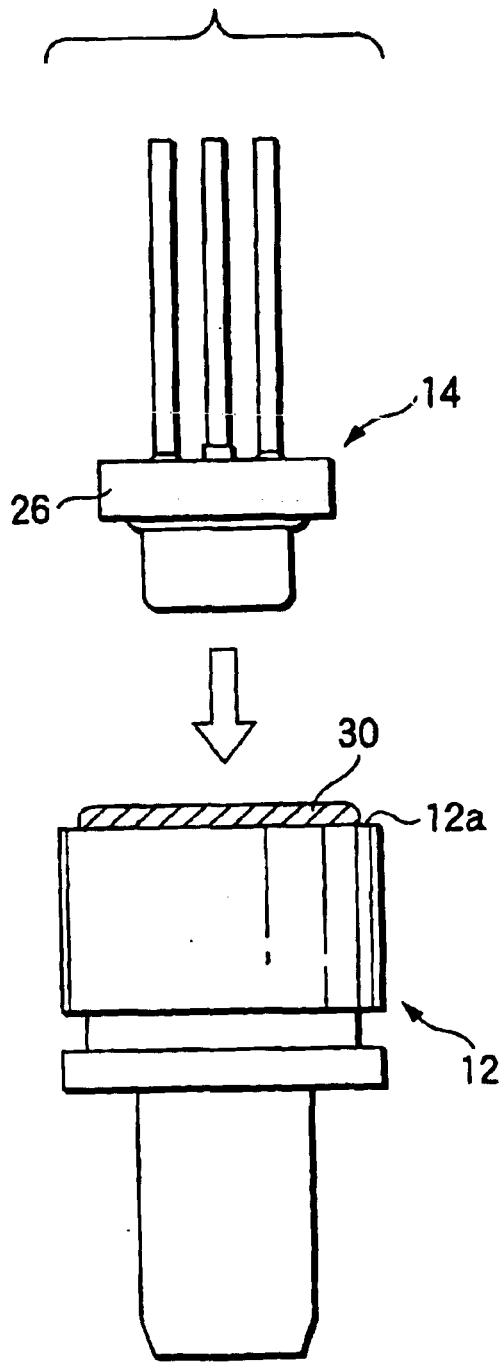
FIGS. 2A and 2B are explanatory views showing a state of application of an ultraviolet-or-heat-curable resin.
Figure 2B:
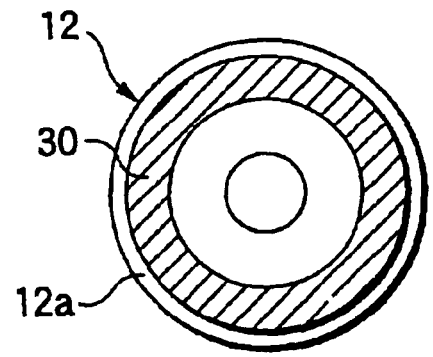

Temporary fixation is performed as follows. As shown in FIGS. 2A and 2B, after the end portion (flange surface) 12a of the resin housing 12 is cleaned, the ultraviolet-or-heat-curable resin (adhesive agent) 30 is applied onto the end portion 12a circularly. The ultraviolet-or-heat-curable resin 30 used is an epoxy resin containing both a heat-active cationic catalyst and an ultraviolet-active cationic catalyst and preferably having a viscosity of 45000±10000 cps. Application is performed by an automatic or manual rotary coater. The resin is not applied onto the whole of the end portion 12a of the resin housing 12 but is applied onto the end portion 12a except the outer circumferential side left slightly. That is, the resin is applied in the form of a pattern in which the inner circumferential side with a diameter slightly larger than the outer diameter of the stem portion 26 of the laser diode 14 is entirely covered with the resin.

Specific composition examples of the ultraviolet-or-heat-curable resin are as follows.

Example 1

Epoxy resin containing no curing agent (chief material of EPO-TEK353ND made by Epoxy Technology Corp.): 50 parts Ultraviolet-curable epoxy resin containing an ultraviolet-curable catalyst (EPO-TEK0G142 made by Epoxy Technology Corp.): 50 parts Heat-curable cationic catalyst (Optomer CP77 made by ASASHI DENKI KOGYO KK.): 5 parts Example 2

Epoxy resin containing no curing agent (KRM2110 made by ASASHI DENKI KOGYO KK.): 100 parts Ultraviolet-curable cationic catalyst (Optomer SP150 made by ASASHI DENKI KOGYO KK.): 4 parts Heat-curable cationic catalyst (Optomer CP77 made by ASASHI DENKI KOGYO KK.): 5 parts Example 3

Epoxy resin containing no curing agent
(EPIKOTE 828 made by YUKA SHELL EPOXY CO., LTD.): 60 parts
(CELOXIDE 2021 made by DAICEL CHEMICAL INDUCTRIES, LTD.): 30 parts
(EHPE 3150 made by DAICEL CHEMICAL INDUCTRIES, LTD.): 10 parts Ultraviolet-curable cationic catalyst (Optomer SP172 made by ASASHI DENKI KOGYO KK.): 2 parts Heat-curable cationic catalyst (CI2624 made by NIPPON SODA CO., LTD.): 3 parts Example 4

Epoxy resin containing no curing agent
(EPIKOTE 828 made by YUKA SHELL EPOXY CO., LTD.): 30 parts
(CELOXIDE 2021 made by DAICEL CHEMICAL INDUCTRIES, LTD.): 60 parts
(EHPE 3150 made by DAICEL CHEMICAL INDUCTRIES, LTD.): 10 parts Ultraviolet-curable cationic catalyst (Optomer SP172 made by ASASHI DENKI KOGYO KK.): 2 parts Heat-curable cationic catalyst (CI2946 made by NIPPON SODA CO., LTD.): 2 parts The stem portion 26 of the laser diode 14 is made to abut on the end portion 12a of the resin housing 12 as shown in FIG. 2A and hence the stem portion 26 is center-aligned.

Figure 3:
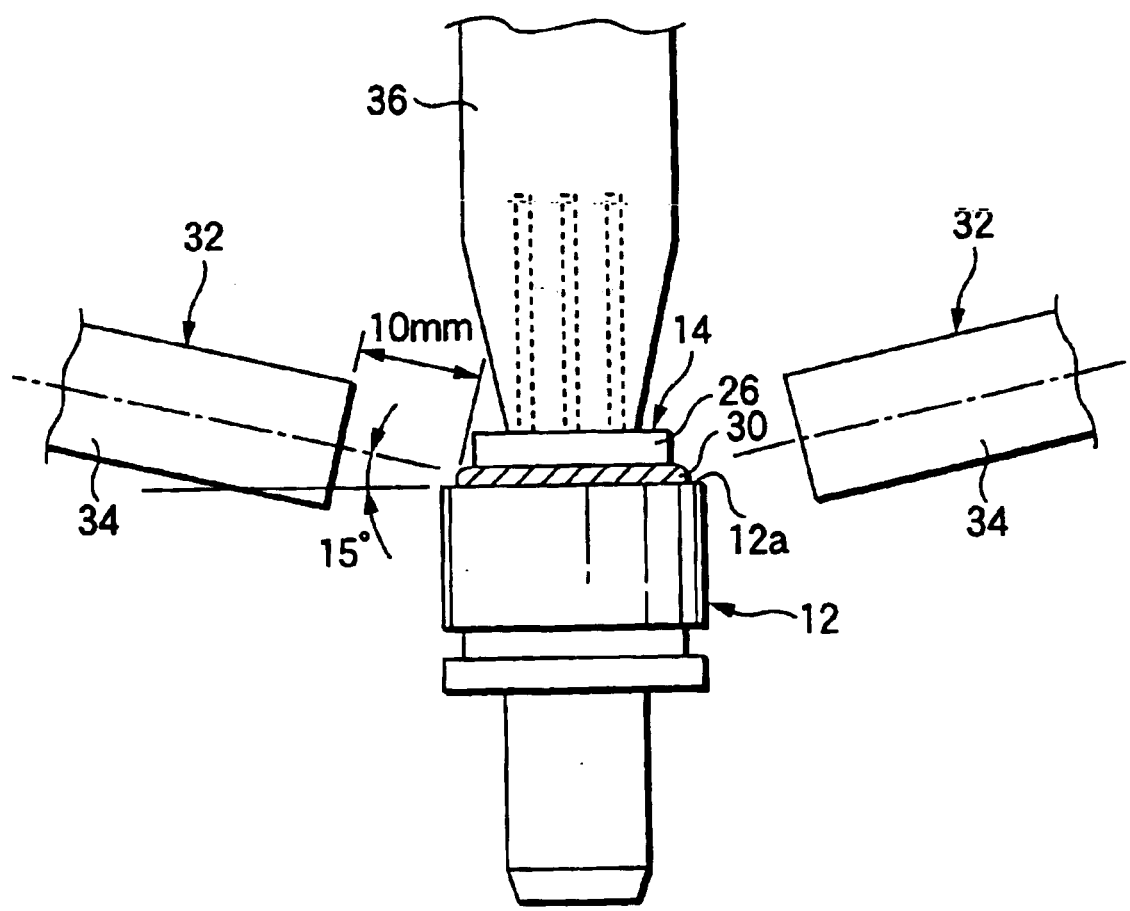
FIG. 3 is an explanatory view showing a state of ultraviolet-ray irradiation.

That is, the mount position of the stem portion 26 is adjusted so that laser light emitted from the laser diode 14 and output from an optical fiber in a ferrule of an optical plug attached into the bore 18 is maximized in intensity when monitored. Further, as shown in FIG. 3, the ultraviolet-or-heat-curable resin 30 is irradiated with ultraviolet rays for a predetermined time by an ultraviolet-ray irradiator 32. As a result, the laser diode 14 and the housing 12 are temporarily fixed to each other with their optical axes being kept, so that an adhesive force sufficiently withstanding handling in the post-process can be obtained (tensile strength is not smaller than 2 kgf).

The ultraviolet-ray irradiator has a metal halide lamp with a center wavelength of 365 nm and an output of 200 W. The ultraviolet-ray irradiator is formed so that a target region can be irradiated by bifurcated optical fiber bundles 34 with an output diameter of 5 mmΦ. The averaged illuminance of ultraviolet rays is in a range of from 1500 to 2000 mW/cm$^2$ per optical fiber. In practical irradiation, two ultraviolet-ray irradiators as described above are prepared so that irradiation is performed from four directions (pitch of 90 degrees). As shown in FIG. 3, irradiation is performed in the condition that each of output ends of the optical fiber bundles 34 is fixed in a position distanced by 10 mm from the ultraviolet-or-heat-curable resin 30 and inclined at an angle of 15 degrees with respect to the housing end portion 12a placed on a horizontal plane. The housing 12 and the laser diode 14 are retained by a retention jig 36 during irradiation with ultraviolet rays so that the center-alignment state of the housing 12 and the laser diode 14 is not changed.

Figure 4A:
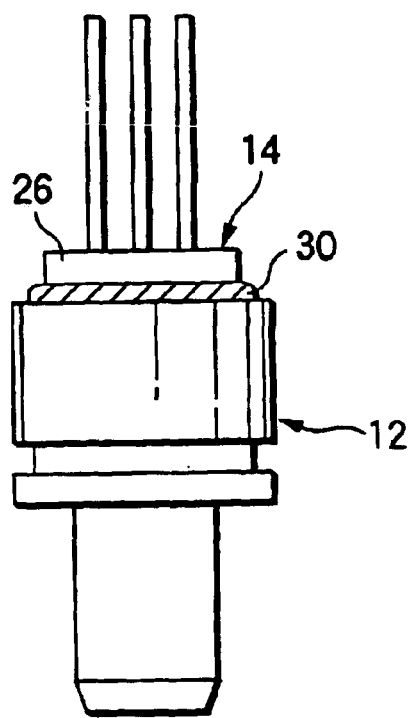
FIGS. 4A and 4B are views for explaining the external appearance of a half-finished product and the external appearance of a finished product.

Because the resin housing 12 has a black or gray opaque body, the overflow portions (see FIG. 1) of the ultraviolet-or-heat-curable resin into the housing are not irradiated with ultraviolet rays at all when the housing 12 and the laser diode 14 are center-aligned and joined with each other. Hence, the overflow portions are still uncured. If temporary fixation with ultraviolet-ray irradiation is completed, the resin housing 12 is taken out from the retention jig 36. The resin housing 12 is then arranged on a tray and introduced into a heating furnace. In the heating furnace, the resin housing 12 is heated at 100° C. for 2 hours. As a result, the portions (overflow portions) not irradiated with ultraviolet rays can be complementarily cured. The external appearance of a half-finished product is shown in FIG. 4A.

Figure 4B:
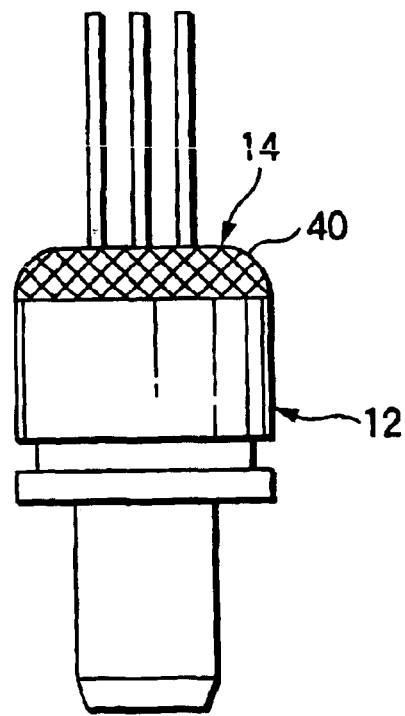

When sufficient strength and sufficient weather resistance cannot be obtained by fixation only with only the ultraviolet-or-heat-curable resin 30, potting with a heat-curable resin 40 is applied to reinforce adhesion. That is, the heat-curable resin 40 is applied circularly along the outer circumferential surface of the stem portion 26 of the optical semiconductor device on the housing end portion 12a so that the ultraviolet-or-heat-curable resin 30 is entirely covered with the heat-curable resin 40. The heat-curable resin 40 is atmospherically heated on a predetermined condition, thereby being cured. For example, a 1-liquid-component epoxy resin (viscosity of 37000 cps, Tg=115° C.) is used as the heat-curable resin. This resin is introduced into the heating furnace again and heated at 100° C. for 2 hours, thereby being cured. As a result, the adhesive strength (tensile strength) reaches 20 kgf or larger. The external appearance of a finally finished product is shown in FIG. 4B.

The finally finished product obtained in the aforementioned manner is subjected to a durability test in an environment of 85° C. and 85% RH for 1000 hours. As a result, the tensile strength can be kept 15 kgf or larger. In addition, obvious deterioration of optical and electric characteristic is not observed.

As described above, because the ultraviolet-or-heat-curable resin is used in the present invention, it is possible to use effectively the merit of the ultraviolet-curing that the housing and the optical semiconductor device can be fixed to each other rapidly, easily and accurately by ultraviolet-ray irradiation. Hence, displacement of the optical axis after center-alignment can be reduced, so that performance such as reproducibility in terms of attachment and detachment, wiggling characteristic, and so on, can be improved. Moreover, because complementarily curing is performed by heating after ultraviolet-ray irradiation, the problem (of overflow of an uncured resin) in the background-art ultraviolet-curable adhesive agent can be solved. Moreover, because the thermal influence on the optical semiconductor device can be reduced, there is a further advantage that the range for selection of the device can be widened.

Moreover, when reinforcement adhesion with a heat-curable resin is applied in addition to the ultraviolet-or-heat-curable resin, the adhesive strength can be made sufficiently large. Hence, weather resistance is improved, so that reliability is improved remarkably.

What is claimed is:

1. A method of producing an optical module having an optical semiconductor device and a housing supporting the semiconductor device, the method comprising the steps of:

applying an ultraviolet-or-heat-curable resin onto a joint portion between said housing and said optical semiconductor device;

at least partially curing the ultraviolet-or-heat-curable resin by irradiation with ultraviolet rays; and completely curing the ultraviolet-or-heat-curable resin by application of heat.

2. The method of claim 1, further comprising:

applying a heat-curable resin onto an exterior of die first ultraviolet-or-heat-curable resin; and curing the heat-curable resin.

3. The method of claim 2, wherein the heat-curable resin is applied onto the exterior of the ultraviolet-or-heat-curable resin after the ultraviolet-or-heat-curable resin is completely cured.

4. The method of claim 2, wherein the heat-curable resin is applied onto the exterior of the ultraviolet-or-heat-curable resin after the ultraviolet-or-heat-curable resin is at least partially cured by the irradiation with the ultraviolet rays but before the ultraviolet-or-heat-curable resin is completely cured by the application of the heat.

5. The method of claim 4, wherein the heat-curable resin and the ultraviolet-or-heat-curable resin are concurrently cured by the application of the heat.

6. A method of producing an optical module in which with respect to a housing having an optical part received therein, an optical semiconductor device of a package structure is center-aligned to be positioned on an optical axis of said optical part and attached to said housing, said optical module being assembled through said method comprising the steps of:

applying an ultraviolet-or-heat-curable resin onto a joint surface between said housing and said optical semiconductor device, and curing said ultraviolet-or-heat-curable resin by external irradiation with ultraviolet rays in a condition that the optical axis of said optical semiconductor device is center-aligned and joined with that of said optical part in said housing to thereby temporarily fix said optical semiconductor device to said housing; and heating said ultraviolet-or-heat-curable resin to completely cure non-irradiated portions of said ultraviolet-or-heat-curable resin.

7. A method of producing an optical module in which with respect to a housing having a lens received therein, an optical semiconductor device of a package structure is center-aligned to be positioned on an optical axis of said lens and attached to said housing, said optical module being assembled through said method comprising the steps of:

applying an ultraviolet-or-heat-curable resin circularly onto a joint surface between an end portion of said housing and a stem portion of said optical semiconductor device and curing said ultraviolet-or-heat-curable resin by irradiation with ultraviolet rays from the outside of said stem portion in the condition that said optical axis of said optical semiconductor device is center-aligned and joined with that of said lens in said housing to thereby temporarily fix said optical semiconductor device to said housing;

heating said ultraviolet-or-heat-curable resin to completely cure non-irradiated portions of said ultraviolet-or-heat-curable resin; and applying a heat-curable resin circularly along the outer circumferential surface of said stem portion of said optical semiconductor device on said end portion of said housing to cover said ultraviolet-or-heat-curable resin with said heat-curable resin and* curing said heat-curable resin by atmospheric heating to thereby reinforce adhesion between said optical semiconductor device and said housing.

8. A method of producing an optical module in which with respect to a housing having a lens received therein, an optical semiconductor device of a package structure is center-aligned to be positioned on an optical axis of said lens and attached to said housing, said optical module being assembled through said method comprising the steps of:

applying an ultraviolet-or-heat-curable resin circularly onto a joint surface between an end portion of said housing and a stem portion of said optical semiconductor device and curing said ultraviolet-or-heat-curable resin by irradiation with ultraviolet rays from the outside of said stem portion in the condition that said optical axis of said optical semiconductor device is center-aligned and joined with that of said lens in said housing to thereby temporarily fix said optical semiconductor device to said housing;

applying a heat-curable resin circularly along the outer circumferential surface of said stem portion of said optical semiconductor device on said end portion of said housing to cover said ultraviolet-or-heat-curable resin with said heat-curable resin to thereby completely cure non-irradiated portions of said ultraviolet-or-heat-curable resin and, at the same time, to thereby reinforce adhesion between said optical semiconductor device and said housing by atmospheric heating.

9. A method of producing an optical module according to claim 7 wherein said housing contains said lens and forms a structure for fittingly holding a ferrule of a counter optical plug so that said optical semiconductor device of said package structure is fixed while center-aligned so as to be positioned on an optical axis of said lens and said ferrule.

10. A method of producing an optical module according to claim 6 wherein said housing is made of an opaque resin and said optical semiconductor device has a metal cap type package structure.

11. A method of producing an optical module according to claim 7 wherein said housing is made of an opaque resin and said optical semiconductor device has a metal can type package structure.

12. A method of producing an optical module according to claim 8 wherein said housing is made of an opaque resin and said optical semiconductor device has a metal can type package structure.

13. A method of producing in optical module according to claim 8 wherein said housing contains said lens and forms a structure for fittingly holding a ferrule of a counter optical plug so that said optical semiconductor device of said package structure is fixed while center-aligned so as to be positioned on an optical axis of said lens and said ferrule.

14. The method of claim 1 further comprising the step of aligning the housing and optical semiconductor device by movement at the joint portion.

* * * * *